United States Patent
Fischer et al.

(10) Patent No.: US 7,761,774 B2
(45) Date of Patent: Jul. 20, 2010

(54) HIGH SPEED CAM LOOKUP USING STORED ENCODED KEY

(75) Inventors: Jeffrey Herbert Fischer, Cary, NC (US); Michael ThaiThanh Phan, Cary, NC (US); Chiaming Chai, Chapel Hill, NC (US); James Norris Dieffenderfer, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 1069 days.

(21) Appl. No.: 11/262,063

(22) Filed: Oct. 28, 2005

(65) Prior Publication Data

US 2007/0113158 A1 May 17, 2007

(51) Int. Cl.
G11C 29/00 (2006.01)
(52) U.S. Cl. ...................... 714/768; 714/805
(58) Field of Classification Search ................. 714/763, 714/773, 768, 805
See application file for complete search history.

(56) References Cited

U.S. PATENT DOCUMENTS

| | | | | |
|---|---|---|---|---|
| 5,253,328 A | * | 10/1993 | Hartman | 706/25 |
| 5,327,534 A | * | 7/1994 | Hutchison et al. | 709/226 |
| 5,455,834 A | * | 10/1995 | Chang et al. | 714/768 |
| 5,491,703 A | * | 2/1996 | Barnaby et al. | 714/766 |
| 5,652,580 A | * | 7/1997 | Saxena | 341/50 |
| 5,680,566 A | * | 10/1997 | Peng et al. | 711/206 |
| 5,835,962 A | * | 11/1998 | Chang et al. | 711/206 |
| 6,067,656 A | * | 5/2000 | Rusu et al. | 714/768 |
| 6,230,231 B1 | * | 5/2001 | DeLong et al. | 711/3 |
| 6,308,297 B1 | * | 10/2001 | Harris | 714/773 |
| 6,618,281 B1 | * | 9/2003 | Gordon | 365/49.15 |
| 6,690,595 B1 | * | 2/2004 | Srinivasan et al. | 365/49.17 |
| 6,700,827 B2 | * | 3/2004 | Lien et al. | 365/222 |
| 6,754,799 B2 | * | 6/2004 | Frank | 711/216 |
| 6,760,881 B2 | * | 7/2004 | Batson et al. | 714/773 |
| 6,870,749 B1 | * | 3/2005 | Park et al. | 365/49.1 |

(Continued)

FOREIGN PATENT DOCUMENTS

GB 2268297 5/1994

OTHER PUBLICATIONS

International Search Report—PCT/US06/060371, International Search Authority—European Patent Office—Apr. 4, 2007.

(Continued)

*Primary Examiner*—Stephen M Baker
(74) *Attorney, Agent, or Firm*—Peter M. Kamarchik; Nicholas J. Pauley; Sam Talpalatsky

(57) ABSTRACT

The search key and key fields of a CAM in a cache are encoded with a Hamming distance of at least two to increase the speed of the CAM by ensuring each mismatching match line is discharged by at least two transistors in parallel. Where the cache is physically tagged, the search key is a physical address. The page address portion of the physical address is encoded prior to being stored in a TLB. The page offset bits are encoded in parallel with the TLB access, and concatenated with the encoded TLB entry. If a page address addresses a large memory page size, a plurality of corresponding sub-page addresses may be generated, each addressing a smaller page size. These sub-page addresses may be encoded and stored in a micro TLB. The encoded key and key field are tolerant of single-bit soft errors.

27 Claims, 4 Drawing Sheets

U.S. PATENT DOCUMENTS

| | | | |
|---|---|---|---|
| 6,883,077 B2 * | 4/2005 | Kimura et al. | 711/164 |
| 6,978,343 B1 * | 12/2005 | Ichiriu | 711/108 |
| 6,987,684 B1 * | 1/2006 | Branth et al. | 365/49.17 |
| 6,993,623 B2 * | 1/2006 | Regev et al. | 711/108 |
| 7,010,741 B2 * | 3/2006 | Foss et al. | 714/805 |
| 7,089,398 B2 | 8/2006 | Zhang | |
| 7,100,097 B2 * | 8/2006 | Patella et al. | 714/718 |
| 7,152,140 B2 * | 12/2006 | Sit et al. | 711/108 |
| 7,200,793 B1 * | 4/2007 | Kengeri et al. | 714/768 |
| 7,216,284 B2 * | 5/2007 | Hsu et al. | 714/766 |
| 7,237,156 B1 * | 6/2007 | Srinivasan et al. | 714/719 |
| 7,237,172 B2 * | 6/2007 | Regev et al. | 714/754 |
| 7,257,763 B1 * | 8/2007 | Srinivasan et al. | 714/764 |
| 7,296,210 B2 * | 11/2007 | Driediger | 714/766 |
| 7,304,873 B1 * | 12/2007 | Gupta | 365/49.1 |
| 7,305,519 B1 * | 12/2007 | Nagaraj | 711/108 |
| 7,366,829 B1 * | 4/2008 | Luttrell et al. | 711/108 |
| 7,472,231 B1 * | 12/2008 | Cihla et al. | 711/144 |
| 2005/0010719 A1 | 1/2005 | Slavin | |
| 2005/0289407 A1 * | 12/2005 | Noda et al. | 714/710 |

OTHER PUBLICATIONS

Written Opinion—PCT/US06/060371, International Search Authority—European Patent Office—Apr. 4, 2007.

* cited by examiner

HIGH SPEED CAM LOOKUP USING STORED ENCODED KEY

BACKGROUND

The present invention relates generally to the field of electronic circuits and in particular to a method of high speed access to a content addressable memory using encoded key fields and a stored encoded key.

Microprocessors perform computational tasks in a wide variety of applications, including embedded applications such as portable electronic devices. The ever-expanding feature set and enhanced functionality of such devices requires ever more computationally powerful processors. Hence, processor improvements that increase execution speed are desirable.

Most modern processors capitalize on the spatial and temporal locality properties of most programs by storing recently executed instructions and recently accessed data in one or more cache memories for ready access by an instruction execution pipeline. A cache is a high-speed, usually on-chip, memory structure comprising a Random Access Memory (RAM) and corresponding Content Addressable Memory (CAM). The instructions or data reside in a cache "line" stored in the RAM. To determine whether a particular datum resides in the RAM, a portion of its address is applied to the CAM. A CAM is a particular memory structure wherein an applied compare input (referred to herein as the key or search key) is simultaneously compared to data stored in each CAM entry (referred to herein as a key field), and the output of the CAM is an indication of which, if any, key field matches the key. In a cache, the key and key fields are portions of (virtual or physical) addresses, and if a match occurs (i.e., the access "hits" in the cache), the location of the match indexes the RAM, and the corresponding cache line is accessed.

FIG. 1 depicts a functional block diagram of a portion of one key field of a CAM structure, indicated generally by the numeral 100. The CAM key field j includes a match line 102 that spans all bit positions of the $j^{th}$ key field 110. The match line 102 is pulled high by a PRECHARGE signal turning on the gate of a pass transistor 104 connecting the match line 102 to power. At each bit of the $j^{th}$ CAM entry, a pass transistor 106 is interposed between the match line 102 and ground. The gate of the discharge transistor 106 is the logical XOR 108 of a key 112 bit and the corresponding key field 110 bit. At each $i^{th}$ bit position, if the key 112 bit and the key field 110 bit match, the output of the XOR gate 108 is low and the pass transistor 106 does not conduct charge from the match line 102 to ground. If the key 112 bit and the key field 110 bit mismatch, the output of the XOR gate 108 is high, turning on the pass transistor 106 and pulling the match line 102 low.

In this manner, if any bit of the key 112 mismatches with any corresponding bit of the key field 110, the match line 102 is pulled low. Conversely, only if every bit of the key 112 and the key field 110 match is no path to ground established, and the match line 102 remains high. A sense circuit 114 detects the level of the $j^{th}$ match line 102 at a time determined by the worst-case match line 102 discharge time. If each key field 110 is unique, which is the case in normal cache operation, then only one key field 110 should match the key 112. In that case, only one match line 102 within the CAM will remain high. To ensure this is the case, the output of each match line sense circuit 114 goes to a collision detection circuit 116, which detects multiple matches, and generates an error if they occur. In CAM applications other than a cache memory, multiple matches may occur, and a priority encoder (not shown) may select from among two or more key fields 110 that match an applied key 112.

The key fields 110 of a representative CAM may be 20 to 30 bits wide, and the CAM may include 256 entries. Thus, the CAM may include 5,000 to over 7,000 match line discharge transistors 106. To implement such a large number of transistors 106 in a small chip area requires that each transistor 106 be small. Since small transistors 106 have lower current-carrying capacity, they require a longer duration to discharge the match line 102 in the event of data miscompare. The worst case is a single-bit miscompare between the key 112 and a key field 110, wherein only one transistor 106 is turned on, and it must carry the current to dissipate all the charge on the match line 102. If two or more bits miscompare, then two or more transistors 106 work in parallel to discharge the match line 102 more rapidly. Consequently, the overall speed of operation of the CAM is determined by the timing of a single-bit miscompare.

Faster CAM operation can therefore be obtained by ensuring that at least two bits of every mismatching key field 110 will miscompare. It is known in the art to encode the key fields 110 (and correspondingly, the key 112) to increase their Hamming distance, which is the number of bits that miscompare between any two digital values. For example, a Hamming distance of two—also known as single-bit parity—ensures that, for a key 112 and key field 110 that differ by one bit, two bits will miscompare between an encoded version of the key 112 and an encoded version of the key field 110. In particular, the two miscomparing bits in the encoded versions are the bit that differs in the unencoded data, and the parity bit. Thus, encoding the key 112 and the key fields 110 with single-bit parity ensures that at least two bits will miscompare on every match line 102 where there is at least a one-bit difference between the key 112 and the key field 110. This ensures that at least two transistors 106 will pull the match line 102 low in parallel, resulting in faster CAM operation.

The key fields 112 can easily be encoded prior to being written to the CAM, when a cache line is replaced in the processing following a cache miss. However, for a physically tagged cache, part of the key 110—the page address—is retrieved from a Translation Lookaside Buffer (TLB) that performs virtual-to-physical address translation, and the remainder—the page offset—comprises the lower-order bits of the virtual address generated in the pipeline. In the case of a virtually tagged cache, the entire key 112 is generated in the pipeline. In either case, retrieving/generating the address and accessing the CAM is on the critical timing path, and there is insufficient time to encode all, or a large part, of the key 112 prior to comparing it against the encoded key fields 110, without increasing the machine cycle time.

SUMMARY

In one or more embodiments, the page address portion of a physical address that is the search key for a CAM look-up is encoded prior to being stored in a TLB. The encoded page address is then retrieved from the TLB in address translation, and applied to the CAM as an encoded search key, to search against encoded key fields in the CAM. The encodings ensure a Hamming distance of at least two, thus guaranteeing at least two transistors in parallel discharging a match line for each non-matching key field in the CAM. Page offset bits of a physical address, that are not stored in the TLB, may be encoded in parallel with the TLB access, and the two encoded physical address portions concatenated prior to accessing the CAM. In one embodiment, where the page address stored in the TLB addresses a large memory page size, the page address may be split into a plurality of sub-page addresses, each addressing a smaller page size. These sub-page addresses may be encoded prior to storing them in a micro TLB.

One embodiment relates to a method of accessing a Content Addressable Memory (CAM) having a plurality of encoded key fields. A search key is encoded and stored. The CAM is accessed using the stored, encoded search key.

Another embodiment relates to a method of matching an address in a Content Addressable Memory (CAM). An encoded version of the address is stored as a key field in the CAM. An encoded version of at least a first part of the address is stored in a Translation Lookaside Buffer (TLB). The encoded address from the TLB is compared against a plurality of encoded key fields in the CAM to detect a match.

Another embodiment relates to a processor. The processor includes a cache memory comprising a Content Addressable Memory (CAM) and Random Access Memory (RAM). The cache is operative to store or supply data to or from a RAM entry when a search key matches a corresponding key field stored in the CAM. The key field is encoded by a Hamming distance of at least two. The processor also includes a Translation Lookaside Buffer (TLB) operative to store and output physical addresses as search keys for the CAM. The physical addresses are encoded by the same algorithm as the CAM key fields.

DETAILED DESCRIPTION

Figure 1:
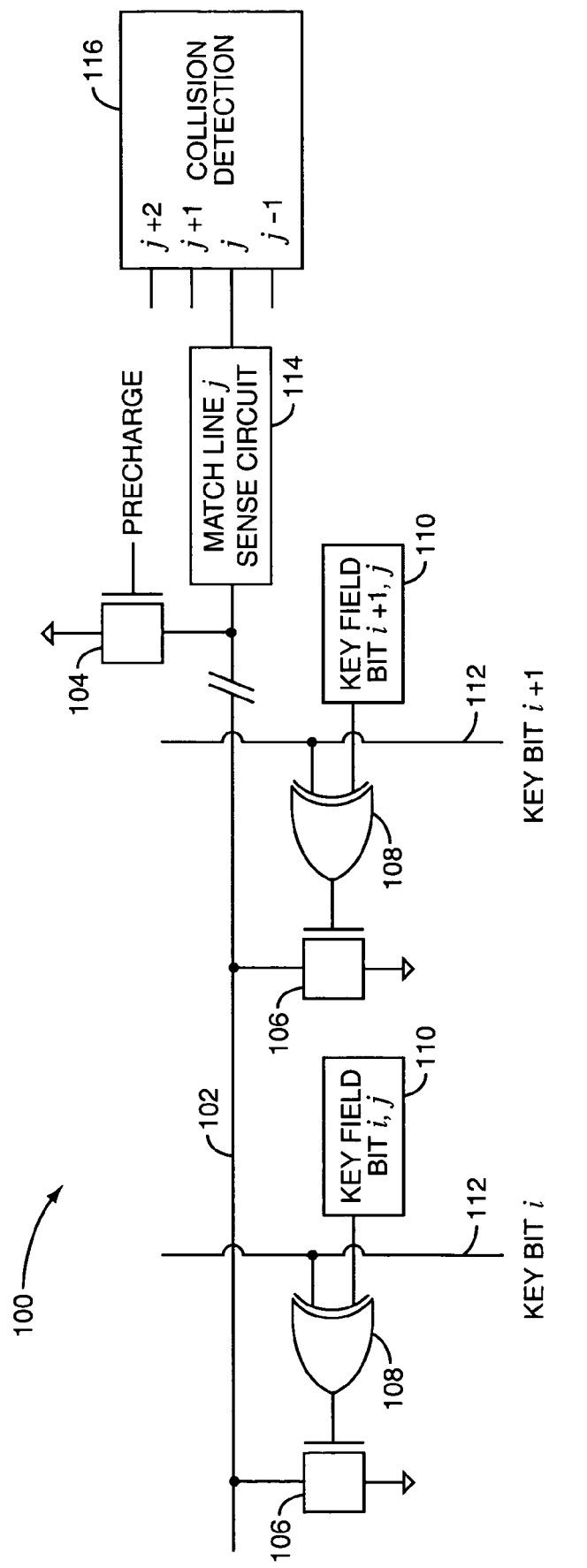
FIG. 1 is a functional block diagram of part of a representative match line in a CAM structure.
Figure 2:
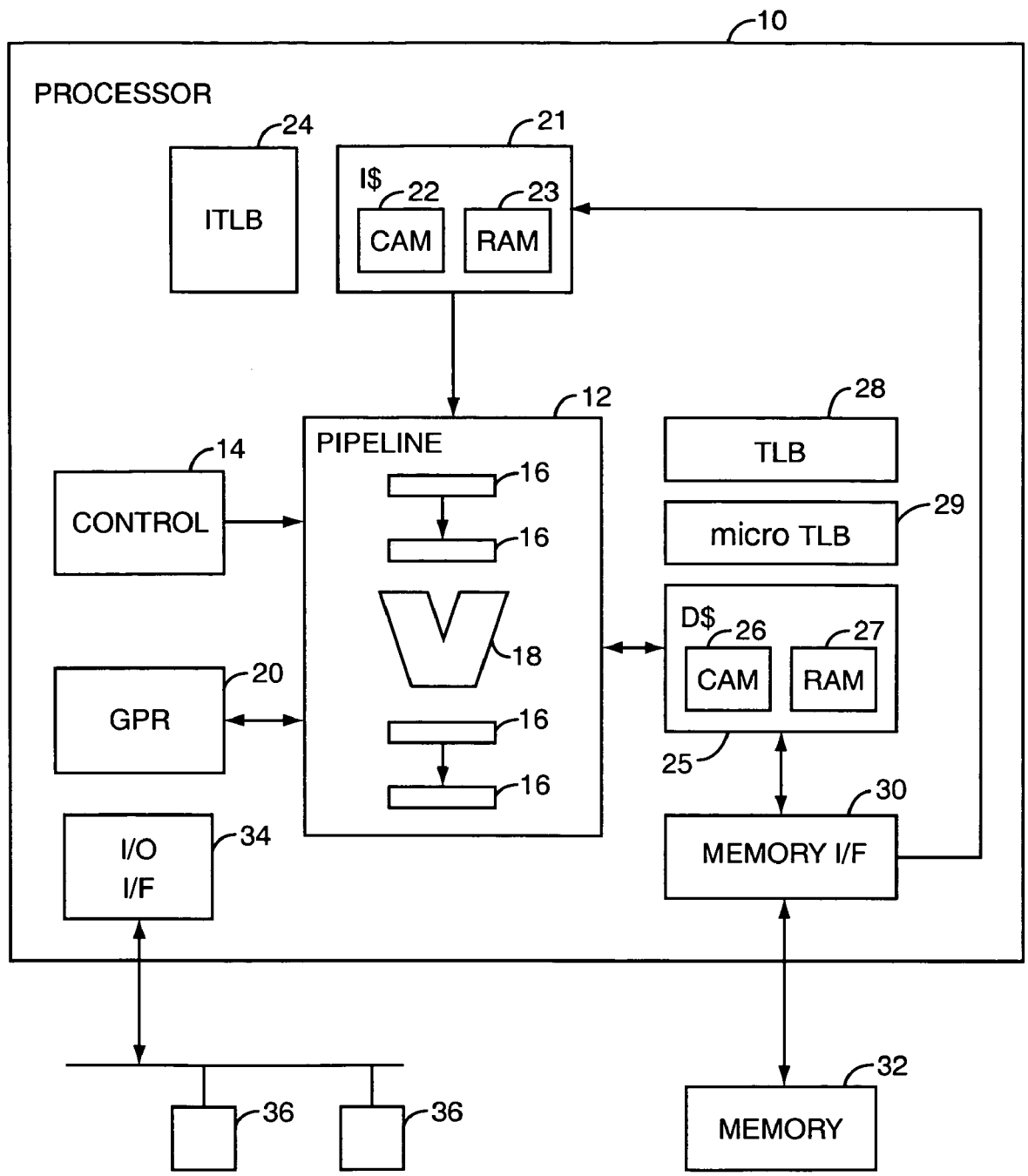
FIG. 2 is a functional block diagram of a processor.

FIG. 2 depicts a functional block diagram of a representative processor 10. The processor 10 executes instructions in an instruction execution pipeline 12 according to control logic 14. The pipeline includes various registers or latches 16, organized in pipe stages, and one or more Arithmetic Logic Units (ALU) 18. A General Purpose Register (GPR) file 20 provides registers comprising the top of a memory hierarchy.

The pipeline fetches instructions from an Instruction Cache (I-cache) 21, which includes a CAM 22 and RAM 23. Instruction memory addressing and permissions are managed by an Instruction-side Translation Lookaside Buffer (ITLB) 24. Data is accessed from a Data Cache 25, including a CAM 26 and RAM 27. Data memory addressing and permissions are managed by a main TLB 28. In various embodiments, the ITLB 24 may comprise a copy of part of the TLB 28. Alternatively, the ITLB 24 and TLB 28 may be integrated.

Additionally, the processor 10 may include a micro TLB 29. The micro TLB 29 is a small, high-speed circuit that generally holds the most recently accessed physical addresses from the main TLB 28. The processor 10 may first apply a virtual address to the micro TLB 29, and access the main TLB 28 only if the corresponding page address and attributes are not found in the micro TLB 29. In one embodiment, the micro TLB 29 entries may address smaller page sizes than corresponding TLB 28 entries, as discussed herein.

In various embodiments of the processor 10, the I-cache 22 and D-cache 26 may be integrated, or unified. Misses in the I-cache 22 and/or the D-cache 26 cause an access to main (off-chip) memory 32, under the control of a memory interface 30. The processor 10 may include an Input/Output (I/O) interface 34, controlling access to various peripheral devices 36. Those of skill in the art will recognize that numerous variations of the processor 10 are possible. For example, the processor 10 may include a second-level (L2) cache for either or both the I and D caches 21, 25. In addition, one or more of the functional blocks depicted in the processor 10 may be omitted in a particular embodiment.

As well known in the art, most programs execute as if they had exclusive use of the full processor addressable memory (e.g., 32 address bits). This is known as a virtual address, and is the addressing mode utilized in the pipeline. When accessing actual memory, the virtual address is translated to a physical address by the TLB 28 (or ITLB 24 for instructions). The operating system maps each program's virtual addresses to specific regions of memory, known as memory pages. Generally, the upper or most significant bits of a virtual address are mapped to a page address (the part provided by the TLB 28). The lower or least significant bits of the virtual address, known as the page offset, index data within the memory page; the page offset is not translated. For simplicity and clarity, the following discussion is presented in the context of data accesses from the D-cache 25, comparing an address obtained from the TLB 28 to the CAM 26. However, the same disclosure applies to instruction accesses from the I-cache 21, ITLB 24 and I-cache CAM 22.

In one or more embodiments, when accessing a physically tagged cache 25, the encoding of most of the key 112 to be applied to the CAM 26, which is a physical address, is removed from the critical timing path by performing the encoding prior to storing the page address in the TLB 28. Page tables are set up in the TLB 28 by operating system software as programs are initialized. The page addresses may be encoded at that time without impacting processor performance. Subsequently, upon an access to the cache 25, a virtual address from the pipeline is translated by the TLB 28 to obtain an encoded page address. The necessary page offset bits may be encoded in parallel to the TLB 28 look-up, as this portion of the address is much shorter than the page address, the encoding operation may be completed in the available time. The encoded page offset may then be concatenated to the encoded page address provided by the TLB 28, and the parity bits generated by each encoding operation XORed to obtain the final parity bit. The encoded physical address is then applied as a key 112 to the CAM 26, for comparison against the encoded key fields 110. This enables the CAM 26 to operate with a shorter compare time by using encoded key fields 110 and an encoded key 112 to ensure at least two miscompares and hence at least two discharge transistors 106 turned on to discharge the match line 102 in the worse-case event of a single-bit mismatch.

The size of the page address stored in the TLB 28 varies inversely with the size of the memory page it addresses. For a larger page size, fewer are bits are translated and stored in the TLB 28, and more bits of the virtual address are used for the offset. In an application having very large memory pages, the large number of page offset bits may precluding encoding these bits "on the fly," in parallel with the TLB 28 access. In this case, the page addresses may be split into two or more sub-page addresses, each addressing a smaller memory page size. For example, a page address that addresses a 64K memory page may be broken into four sub-page addresses, each addressing a 4K memory page. The TLB 28 attributes for the 64K page may be replicated and associated with each of the sub-page addresses.

The 4K sub-page addresses may not be stored in the TLB 28, as they would collide with the 64K page address when performing a translation operation. In one embodiment, the sub-page addresses are encoded and stored in the micro TLB 29. This is an inefficient use of the micro TLB 29, as, e.g., four entries are required to translate the same range of virtual addresses that requires only one entry in the main TLB 28. However, the encoded sub-page addresses stored in the micro TLB 29 each comprise more bits than the corresponding page address, leaving fewer bits that must be translated on the fly prior to accessing the CAM 26.

Figure 3:
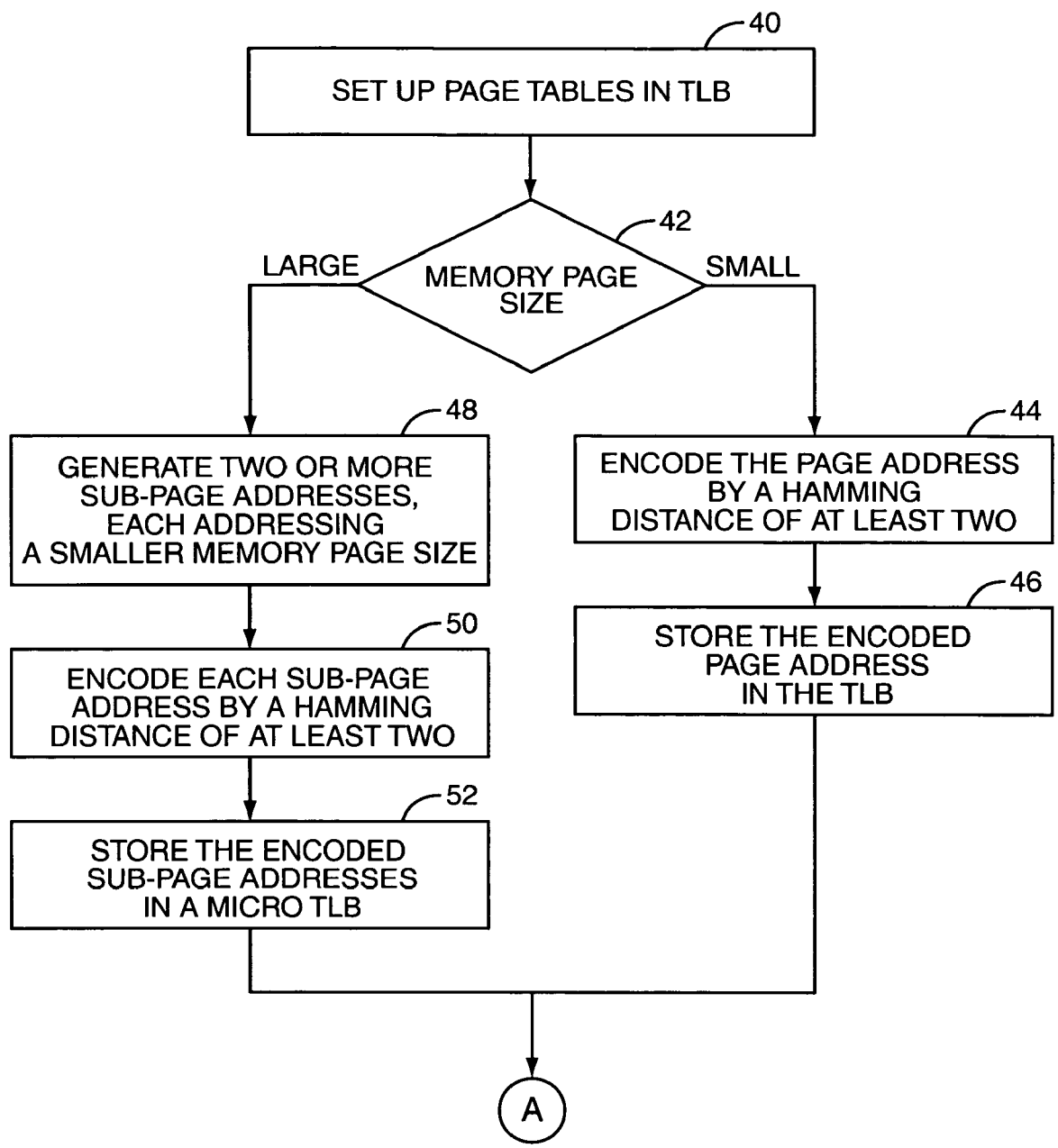
FIG. 3 is a flow diagram of encoding and storing a page address.
Figure 4:
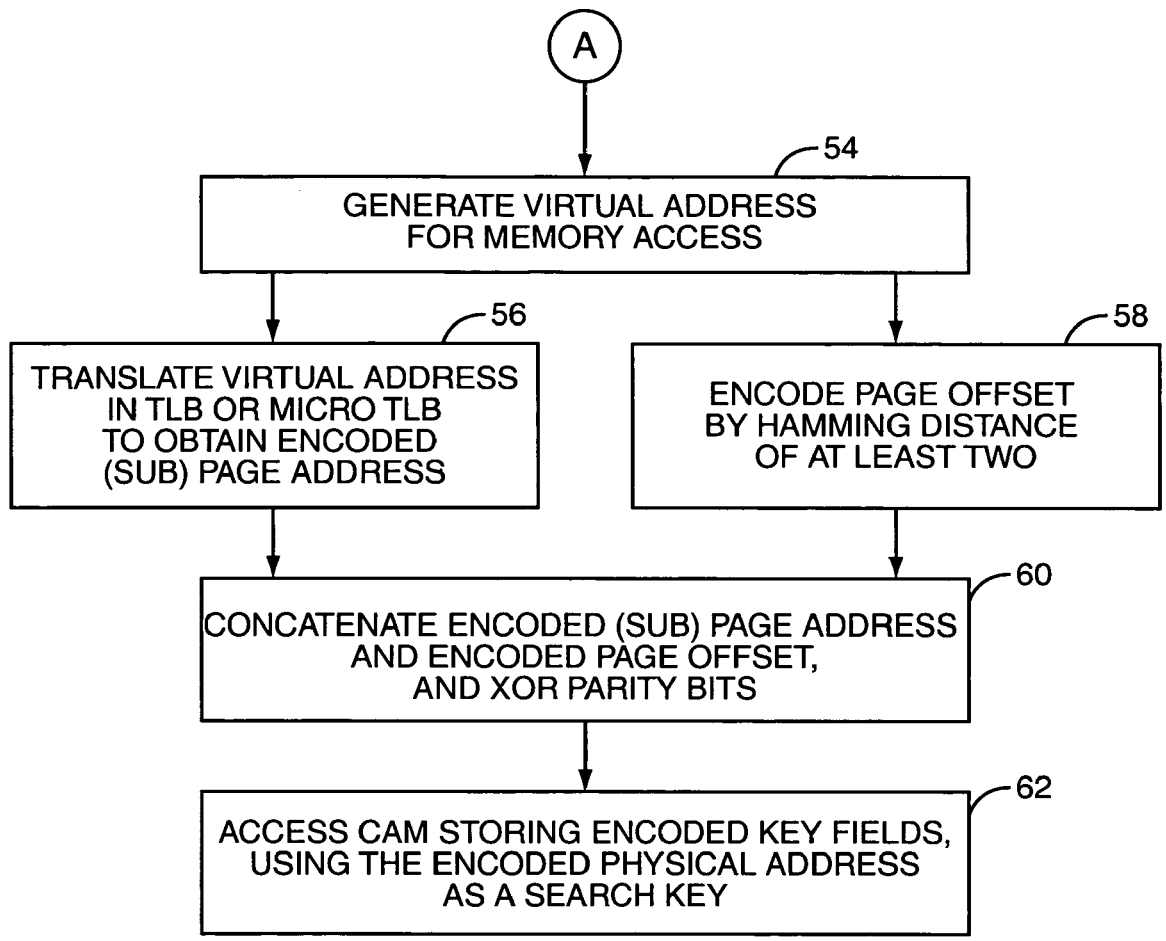
FIG. 4 is a flow diagram of retrieving an encoded page address, encoding a page offset, and applying the encoded physical address to a CAM.

The process of encoding and storing the key 112, and accessing the stored encoded key 112 and applying it to the CAM 26, according to various embodiments, is depicted in flow diagrams in FIGS. 3 and 4. FIG. 3 depicts actions taken when operating system software sets up the TLB 28; FIG. 4 depicts the steps of accessing a CAM 26 during program execution (i.e., on the critical timing path).

Referring to FIG. 3, operating system software sets up page tables in the TLB 28 (block 40). Depending on the size of the memory pages (block 42), the encoding may proceed by different processes. If the pages are relatively small (block 42), meaning the page address is long and the page offset is short, the page address is encoded by a Hamming distance of at least two (block 44). The encoded page address is then stored in the TLB 28 (block 46).

On the other hand, if the memory pages are large (block 42), meaning the page address is shorter and the page offset is longer, there may be insufficient time to encode the necessary portion of the page offset on the fly during address translation. In this case, two or more sub-page addresses may be generated, each addressing a smaller memory page than the corresponding page address (block 48). This increases the length of the sub-page addresses and reduces the length of the corresponding page offsets, allowing the offsets to be encoded on the fly without impacting the machine cycle time. Each sub-page address is encoded by a Hamming distance of at least two (block 50), and the encoded sub-page entries are stored in the micro TLB 29.

Note that the labels "large" and "small" annotating exit paths from decision block 42 are relative. As used herein, a small memory page size is one that generates a page offset small enough to be encoded on the fly by a Hamming distance of at least two in parallel with a TLB 28 access. Conversely, a large memory page size is one that generates a page offset too large to be encoded on the fly in parallel with an access to the TLB 28. The actual memory page size that qualifies as large or small may vary with each implementation, depending on many factors such as semiconductor technology, clock speed, operating voltage, etc. At the conclusion of the flow diagram of FIG. 3, encoded (sub) page addresses of sufficient length are stored in the TLB 28 or micro TLB 29.

During subsequent program execution, a memory access instruction generates a virtual address in the execution pipeline (block 54), and presents the virtual address to the TLB 28 and/or micro TLB 29 for translation. The TLB 28 or micro TLB 29 translates the virtual address, and provides an encoded (sub) page address (block 56). In parallel with the TLB 28 or micro TLB 29 look-up, the necessary portion of the page offset is encoded by a Hamming distance of at least two (block 58). In one embodiment, the encoded (sub) page address and encoded page offset are then concatenated, and the two parity bits are XORed, yielding an encoded physical address having a single parity bit (block 60). This physical address is then presented as a search key 112 to the CAM 26 for comparison against a plurality of encoded key fields 110 (block 62).

In another embodiment, the page address and page offset are stored as separate key fields 110 per CAM entry 100. That is, each CAM entry 100 includes two match line 102 segments, and a discharge of either segment would signal a mismatch. In one embodiment, each match line 102 segment includes a match line sense circuit 114, and the outputs of the match line sense circuits 114 are AND'ed together before being applied to the collision detection logic 116. In this case, the encoded page address from the TLB 28 or sub page address from the micro TLB 29 is applied to the corresponding page address portion of the CAM 26. In parallel with the TLB 28 or micro TLB 29 access, the page offset is encoded by a Hamming distance of at least two. The encoded page offset is then applied to the CAM 26 in parallel with the (sub) page address. Each of the encoded (sub) page address and encoded page offset include a parity bit.

In other embodiments, the match lines 102 of the CAM 26 (and correspondingly, the keys 110) may be further segmented, as necessary or desired, for speed, fan-out, power consumption, or other design considerations. The number and bit length of each segment may be dictated by the technology of the implementation, the layout, the number of bits to be compared, the required cycle speed, and the like. Furthermore, the segments may be configured and arranged in a variety of ways that require only one match line sense circuit 114 per CAM entry 100. For example, in one embodiment, the match line 102 segments may be cascaded together, or rippled, such that an active discharge circuit 106 in any segment will discharge the entire match line 102. In another embodiment, the match line 102 may assume a hierarchical structure wherein each segment connects to a global match line 102, which discharges whenever any of the attached segments discharge. Those of skill in the art will recognize a wide variety of ways in which the match line 102 may be advantageously segregated.

As will be appreciated by those of skill in the art, the encoded key fields 110 are loaded into the CAM 26 over time by cache miss processing operations. Upon a cache miss, a memory access instruction fetches the desired data from main memory, and places them in the RAM 27, replacing existing information. The corresponding CAM 26 entry is replaced with the encoded physical address that missed.

By encoding the key 112 and key fields 110 of a CAM 26 using a Hamming distance of at least two, at least two discharge transistors 106 will discharge a match line 102 to ground, for each key field 110 that differs from the key 112 by at least one bit. The overall CAM 26 timing may be advantageously set to the time required for two transistors 106 to discharge a match line 102, rather than the time required for one transistor 106 to do so, thus improving the operating speed of the CAM 26.

All solid-state memory is prone to soft errors, which are errors in the stored data caused by charged particles or radiation. Soft errors may be caused by alpha particles, or electrical disturbance caused by cosmic rays. Both forms of radiation are random, and soft errors may induce a single-bit error in a key field 110. This raises the prospect of a single-bit mismatch between the key 112 and a key field 110. Several possibilities are considered.

First, if the key 112 matches a key field 110, and the matching key field 110 receives a single-bit soft error, the corresponding CAM 26 entry may or may not be detected as a hit. Because the overall CAM 26 timing is set using a worst-case scenario of two miscompares per match line 102, a single-bit miscompare may have insufficient time to fully discharge the corresponding match line 102 prior to evaluation by the sense circuit 114. In this case, the match line 102 will be detected in a high state, indicating a match. Since the key 112 should match this key field 110, and is only in danger of being interpreted as a mismatch due to a soft error, then detecting a match yields proper operation of the cache 26, and the soft error is of no consequence.

In a second case, the single-bit miscompare due to a soft error may pull the match line 102 low sufficiently quickly for the associated sense circuit 114 to consider the CAM 26 entry a mismatch. Since the key 112 should additionally mismatch every other CAM 26 entry, this results in an address erroneously missing in the cache when it should have hit. The processor 10 will detect a cache miss, and perform an access to main memory 32, replacing the corresponding line in the cache 25 and updating the CAM 26 entry with the missing, encoded address, thus correcting the soft error (at the price of the latency of the main memory access).

Another possibility is that the key 112 matches a first key field 110, and differs from a second key field 110 by a single bit. Due to encoding the key 112 and the key fields 110 with a Hamming distance of two or more, the second (mismatching) key field 110 would normally discharge through at least two discharge transistors 106. If either the mismatching bit or the parity bit is the bit corrupted by a soft error, the corresponding match line 102 will be discharged by only one transistor 106, which may take so long that the corresponding sense circuit 114 detects the match line 102 as high, indicating a match. The key 112 additionally matched the first key field 110; hence, the key 112 appears to have matched, or hit, more than one CAM 26 entry. In this case, the collision detection circuit 116, which monitors the output of all match line sense circuits 114, will detect the apparent duplicate match and cause an error.

Yet another possibility is that a key 112 differs from a key field 110 by two bits. Encoding the key 112 and key field 110 by a Hamming distance of two means they will have the same parity bit. For example, a key field 110 comprising all 0's, with even parity, will have a 0 parity bit. A key 112 comprises two 1's, and all other bits are 0; this key 112 will also have a 0 parity bit. If a soft error corrupts one of the 0 bits of the key field 110 to a 1, in a position corresponding to one of the 1 bits in the key 112, then the key 112 and key field 110 differ by only one bit (the other 1 bit in the key 112). If the CAM 26 timing is set to a worst-case of two discharge circuits 106 per miscompare, the match line 102 may remain high in this case, and an erroneous match will be detected by the CAM 26, generating an erroneous hit in the cache 21, 25.

One way to avoid this possibility is to encode the key 112 and the key field 110 by a Hamming distance of three or more. This is more computationally complex, and requires more than one parity bit for each entry 100 in the CAM 26, as well as for each (sub) page address in the TLB 28 or micro TLB 29. On the other hand, a Hamming distance of three will increase the speed of the CAM 26 (for the same technology), as at least three discharge 106 will discharge each miscomparing match line 102 (at least in the absence of soft errors). Higher order Hamming distances are of course possible and would be an obvious implementation to those of skill in the art, given the teaching of this disclosure. However, there is a diminishing return in CAM 26 speed-up, at the cost of increasing the size of the CAM 26 and its power consumption by adding ever more redundant storage elements 110, XOR gates 108, and discharge transistors 106.

As an alternative to increasing the Hamming distance, the erroneous condition describe above may be detected by the cache controller following the (erroneous) cache hit, and an error generated if the condition is detected. Following a cache hit, the cache controller reads out the key field 110. The parity bit is set aside, and the parity for the remaining key field 110 is regenerated and compared to the parity read from the CAM 26. If the parity bits do not match, the cache controller invalidates the entry 100 and generates an exception. After restoring the machine state to that prior to the cache access, the processor would again access the cache 21, 25, generating a cache miss. The correct, encoded key field 110 will then be written to the CAM 26 as part of the cache miss processing operation. Since the cache controller reads and parity-checks the field key 110 after delivering the cache line to the processor pipeline 12, this operation does not adversely impact cache performance.

Although the present invention has been described herein in the context of a CAM 26 as part of a cache memory 25, those of skill in the art will readily recognize that the invention is not limited to such application. Content Addressable Memories are used in a variety of circuits and systems, including data buffers where addresses are "snooped" to support cache coherency schemes, packet routers where IP addresses are searched against a CAM, and the like. In many such applications, the CAM speed may be improved by encoding the key fields to cause two or more discharge circuits to activate upon a mismatch, without impacting the overall cycle time by storing encoded keys to be applied against the CAM.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of accessing a Content Addressable Memory (CAM) having a plurality of encoded key fields, comprising:
    encoding a search key;
    storing the encoded search key within a translation lookaside buffer (TLB); and
    accessing the CAM using the stored, encoded search key.

2. The method of claim 1 wherein encoding a search key comprises encoding the search key with a Hamming distance of two.

3. The method of claim 1 wherein encoding a search key comprises encoding the search key with a Hamming distance of three.

4. The method of claim 1 wherein accessing the CAM using the stored, encoded search key generates correct results despite a single-bit error in one or more encoded key fields.

5. The method of claim 1 wherein each encoded key field is encoded with a Hamming distance of two and includes a parity bit, and further comprising, if a match is detected between the encoded search key and an encoded key field:
    reading the encoded key field, including the stored parity bit, from the CAM;
    regenerating a parity bit for the encoded key field;
    comparing the regenerated parity bit to the stored parity bit; and if the parity bits miscompare, generating an error.

6. The method of claim 1, wherein the encoding of the search key is performed with software during run-time irrespective of a cache-miss occurrence.

7. The method of claim 1 wherein encoding a search key comprises encoding a first part of the search key, and wherein storing the encoded search key comprises storing the encoded first part of the search key.

8. The method of claim 7 further comprising encoding a second part of the search key, and wherein accessing the CAM using the stored, encoded search key comprises accessing the CAM using the stored, encoded first part of the search key concatenated with the encoded second part of the search key.

9. The method of claim 1, wherein the CAM is included in a cache that is structurally separate from the TLB.

10. The method of claim 9, wherein the cache corresponds to an instruction cache or a data cache.

11. The method of claim 1 wherein the search key comprises a physical address.

12. The method of claim 11 wherein storing the encoded search key comprises storing an encoded page address portion of the physical address in the Translation Lookaside Buffer (TLB).

13. The method of claim 12 further comprising: generating two or more sub-page addresses from the page address, each sub-page address addressing a smaller memory page size than the page address; encoding at least one sub-page address; and
storing the encoded sub-page addresses in a micro TLB;
wherein accessing the CAM using the stored, encoded search key comprises accessing the CAM using one of the encoded sub-page addresses in the micro TLB.

14. A method of matching an address in a Content Addressable Memory (CAM), comprising:
storing an encoded version of the address as a key field in the CAM;
storing an encoded version of a page address portion of the address in a Translation Lookaside Buffer (TLB); and
comparing the encoded address from the TLB against a plurality of encoded key fields in the CAM to detect a match.

15. The method of claim 14 wherein the encoded version of the address is the address encoded with a Hamming distance of two.

16. The method of claim 14 wherein the encoded version of the address is the address encoded with a Hamming distance of three.

17. The method of claim 14 wherein comparing the encoded address from the TLB against a plurality of encoded key fields in the CAM correctly detects a match despite a single-bit error in one or more encoded key fields.

18. The method of claim 14 further comprising encoding a page offset portion of the address, and wherein comparing the encoded address from the TLB against a plurality of encoded key fields in the CAM comprises comparing the encoded page address from the TLB concatenated with the encoded page offset against a plurality of encoded key fields in the CAM.

19. The method of claim 14 further comprising:
generating two or more sub-page addresses from the page address, each sub-page address addressing a smaller memory page size than the page address; encoding at least one sub-page address; and storing the encoded sub-page addresses in a micro TLB;
wherein comparing the encoded address from the TLB against a plurality of encoded key fields in the CAM comprises comparing an encoded sub-page address from the TLB against a plurality of encoded key fields in the CAM.

20. The method of claim 14 wherein each encoded key field in the CAM is encoded with a Hamming distance of two and includes a parity bit, and further comprising, if a match is detected between the encoded address from the TLB and an encoded key field in the CAM:
reading the encoded key field, including the stored parity bit, from the CAM;
regenerating a parity bit for the encoded key field;
comparing the regenerated parity bit to the stored parity bit; and if the parity bits miscompare, generating an error.

21. A processor, comprising:
a cache memory comprising a Content Addressable Memory (CAM) and Random Access Memory (RAM), the cache operative to store or supply data to or from a RAM entry when a search key matches a corresponding key field stored in the CAM, the key fields encoded by a Hamming distance of at least two; and
a Translation Lookaside Buffer (TLB) operative to store and output page addresses as search keys for the CAM, the page addresses encoded by the same algorithm as the CAM key fields.

22. The processor of claim 21 wherein the CAM key fields and the TLB physical addresses are encoded by a Hamming distance of three.

23. The processor of claim 21 further comprising a micro TLB operative to store two or more sub-page addresses corresponding to one page address in the TLB, the sub-page addresses addressing a smaller memory page size than the TLB page address, the micro TLB operative to supply one of the sub-page addresses as a search key for the CAM.

24. The processor of claim 21 wherein each CAM entry comprises a match line precharged to a high state, and discharged through a discharge transistor for each bit of the search key that mismatches a corresponding bit of the key field stored in that entry, and wherein the discharge transistor associated with a parity bit is operative to discharge more current than the other discharge transistors in the CAM entry.

25. The processor of claim 21 wherein, if a search key matches a key field, the cache is further operative to read out the key field and a stored key field parity bit, regenerate a parity bit for the key field, compare the regenerated parity bit and the stored parity bit, and if the parity bits mismatch, generate an error.

26. A processor, comprising:
means for encoding a search key;
means for storing the encoded search key within a translation lookaside buffer (TLB); and
means for accessing a Content Addressable Memory (CAM) having a plurality of encoded key fields using the stored, encoded search key.

27. A computer-readable medium comprising instructions, which, when executed by a processor, cause the processor to perform operations, the instructions comprising:
program code to encode a search key;
program code to store the encoded search key within a translation lookaside buffer (TLB); and
program code to access a Content Addressable Memory (CAM) having a plurality of encoded key fields using the stored, encoded search key.

* * * * *